(12) United States Patent
Okumura

(10) Patent No.: US 11,410,892 B2
(45) Date of Patent: Aug. 9, 2022

(54) SEMICONDUCTOR DEVICE AND METHOD OF INSPECTING SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 327 days.

(21) Appl. No.: 16/773,343

(22) Filed: Jan. 27, 2020

(65) Prior Publication Data

US 2020/0303269 A1 Sep. 24, 2020

(30) Foreign Application Priority Data

Mar. 22, 2019 (JP) ............................. JP2019-054107

(51) Int. Cl.
*H01L 21/66* (2006.01)
*H01L 23/00* (2006.01)
(Continued)

(52) U.S. Cl.
CPC .......... *H01L 22/32* (2013.01); *G01R 31/2884* (2013.01); *G01R 31/2886* (2013.01); *H01L 24/05* (2013.01); *H01L 24/45* (2013.01); *H01L 29/1608* (2013.01); *H01L 29/7393* (2013.01); *H01L 29/861* (2013.01);
(Continued)

(58) Field of Classification Search
CPC ......... H01L 22/32; H01L 24/05; H01L 24/45; H01L 29/1608; H01L 29/7393; H01L 29/861; H01L 2224/04042; H01L 2224/45124; H01L 2224/45147; H01L 2924/00014; H01L 29/0696; H01L 29/417; H01L 29/7397; H01L 29/1095; H01L 29/7811; H01L 29/7813; H01L 2224/0603;
(Continued)

(56) References Cited

U.S. PATENT DOCUMENTS

2017/0042051 A1* 2/2017 Kodaira .................... H05K 1/18
2017/0179018 A1* 6/2017 Inaba .................... H01L 23/053
(Continued)

FOREIGN PATENT DOCUMENTS

JP H11-163067 A 6/1999
JP 2005-051084 A 2/2005
(Continued)

*Primary Examiner* — Giovanni Astacio-Oquendo
(74) *Attorney, Agent, or Firm* — Rabin & Berdo, P.C.

(57) ABSTRACT

A portion of a source electrode exposed by an opening in a passivation film is used as a portion of a source pad. A first portion of the source pad includes a plating film formed by a material that is harder than a material of the source electrode. During screening, a probe needle that is a metal contact contacts the plating film that is on the first portion of the source pad. A second portion of the source pad has a layer structure different from that of the first portion of the source pad and in a second direction parallel to the front surface of the semiconductor chip, is disposed adjacently to and electrically connected to the first portion of the source pad. A bonding wire is wire bonded to the second portion of the source pad after an inspection process of the semiconductor chip.

20 Claims, 12 Drawing Sheets

(51) Int. Cl.
  *H01L 29/16* (2006.01)
  *H01L 29/739* (2006.01)
  *G01R 31/28* (2006.01)
  *H01L 29/861* (2006.01)

(52) U.S. Cl.
  CPC ............... *H01L 2224/04042* (2013.01); *H01L 2224/45124* (2013.01); *H01L 2224/45147* (2013.01)

(58) Field of Classification Search
  CPC ..... H01L 2224/4847; H01L 2224/4911; G01R 31/2884; G01R 31/2886
  USPC ........................ 324/762.07, 762.01, 537, 500
  See application file for complete search history.

(56) References Cited

U.S. PATENT DOCUMENTS

| | | | |
|---|---|---|---|
| 2021/0134758 A1* | 5/2021 | Sawai | H01L 25/50 |
| 2021/0255239 A1* | 8/2021 | Yoshida | G01R 31/2863 |
| 2022/0013508 A1* | 1/2022 | Akiba | H01L 23/49838 |
| 2022/0102309 A1* | 3/2022 | Lee | H01L 23/3121 |

FOREIGN PATENT DOCUMENTS

| | | |
|---|---|---|
| JP | 2006-234403 A | 9/2006 |
| JP | 2006-337247 A | 12/2006 |
| JP | 2010-016103 A | 1/2010 |
| JP | 2011-174946 A | 9/2011 |

\* cited by examiner

SEMICONDUCTOR DEVICE AND METHOD OF INSPECTING SEMICONDUCTOR DEVICE

CROSS REFERENCE TO RELATED APPLICATIONS

This application is based upon and claims the benefit of priority of the prior Japanese Patent Application No. 2019-054107, filed on Mar. 22, 2019, the entire contents of which are incorporated herein by reference.

BACKGROUND OF THE INVENTION

1. Field of the Invention

Embodiments of the invention relate to a semiconductor device and a method of inspecting a semiconductor device.

2. Description of the Related Art

A wiring structure of a conventional semiconductor device will be described taking, as an example, a vertical metal oxide semiconductor field effect transistor (MOSFET) including an insulated gate having a 3-layer structure including a metal, an oxide film, and a semiconductor material. FIG. 17 is a plan view of a layout of the conventional semiconductor device, as viewed from a front surface of a semiconductor chip.

FIG. 18 is a cross-sectional view of a structure along cutting line AA-AA' in FIG. 17. FIG. 21 is a cross-sectional view of another example of the structure along cutting line AA-AA' in FIG. 17. FIGS. 19 and 22 are cross-sectional views during screening of the semiconductor chips depicted in FIGS. 18 and 21, respectively. FIGS. 20 and 23 are cross-sectional views after mounting of the semiconductor chips depicted in FIGS. 18 and 21, respectively.

A conventional semiconductor device 120 depicted in FIGS. 17 and 18 includes, in an active region 101, on a front surface of a semiconductor chip 110, a source electrode 111 that contains aluminum (Al) as a material and a source pad (electrode pad) 121 that includes a portion of the source electrode 111 (indicated by thick line). The source electrode 111 is covered by a polyimide (PI) layer 113 (portion hatched with dots).

A portion of the source electrode 111 exposed in an opening 113a of the polyimide layer 113 is included in the source pad 121. The source pad 121, during screening, is pushed by a predetermined pressure to be in contact with and electrically connected to the probe needle 141 that is a metal contact. Voltage is applied to the source pad 121, via the probe needle 141, under predetermined conditions and current is passed between a source and a drain, whereby electrical characteristics of the conventional semiconductor device 120 are measured (FIG. 19).

After an inspection process (including screening) of the semiconductor chip 110, a pin-shaped wiring member (hereinafter, terminal pin) 133 is bonded to the source pad 121 via a solder layer 132 (FIG. 20). The source pad 121 has a structure in which a surface is covered by a plating film 131 and solder wettability is enhanced. The plating film 131 is formed by a nickel (Ni) plating film and a gold (Au) plating film that are sequentially stacked. The plating film 131 has low contact resistance with the probe needle 141 and during screening, large current can be passed through the semiconductor chip 110.

A conventional semiconductor device 120' depicted in FIG. 21 differs from the conventional semiconductor device 120 depicted in FIGS. 17 and 18 in that instead of the terminal pin, an Al bonding wire 133' (FIG. 23) is bonded to a source pad 121' by wire-bonding (ultrasonic bonding). A surface of a source pad 121' is not covered by a plating film and has high adhesion with the Al bonding wire 133'. During screening, a probe needle 141' is pushed to be in contact with and electrically connected to the surface of the source pad 121'.

In the conventional semiconductor device 120' depicted in FIG. 21, the surface of the source pad 121' is not covered by a plating film and therefore, a small current is passed through the semiconductor chip 110 and screening is performed or screening is not performed. In FIG. 17, the openings 113a, 113b of the polyimide layer 113 are indicated by thick dashed lines. In FIGS. 18, 19, 20, 21, 22, and 23, a gate runner 114 is not depicted. Reference numerals 102, 112, 122 are an edge termination region, a gate metal layer, and a gate pad.

As such a wiring structure of the conventional semiconductor devices, a structure has been proposed in which at a surface of an Al electrode, a Ni plating film and an Au plating film are sequentially provided and through these plating films, a lead frame is bonded to the Al electrode (for example, refer to Japanese Laid-Open Patent Publication No. 2005-51084). In Japanese Laid-Open Patent Publication No. 2005-51084, by the Ni plating film and the Au plating film, a junction between the Al electrode at the surface of a semiconductor chip and the lead frame is reliable.

Further, as another wiring structure of the conventional semiconductor devices, a structure has been proposed in which a source pad containing Al as a metal material is divided into plural source pads and at a surface of each of the source pads, one Al wire is bonded (for example, refer to Japanese Laid-Open Patent Publication No. 2010-16103). In Japanese Laid-Open Patent Publication No. 2010-16103, after packaging, resistance of the conventional semiconductor device is measured, whereby bonding defects of the Al wires are detected.

Further, as another wiring structure of the conventional semiconductor devices, a structure has been proposed in which in addition to a bonding electrode pad, a separate burn-in inspection electrode pad is provided (for example, refer to Japanese Laid-Open Patent Publication No. H11-163067). In Japanese Laid-Open Patent Publication No. H11-163067, during a burn-in inspection, the burn-in inspection electrode pad is used to perform the burn-in inspection, whereby damage of the surface of the bonding electrode pad used as a normal terminal is prevented.

SUMMARY OF THE INVENTION

According to an embodiment of the invention, a semiconductor device having an element structure includes a semiconductor chip having a front surface and a back surface opposite to the front surface, a predetermined element structure provided at a front surface side of the semiconductor chip, a first electrode provided on the front surface of the semiconductor chip, and being electrically connected to the element structure, a protective film having an opening, and being provided on the first electrode so that a portion of the first electrode is exposed from the protective film, an electrode pattern provided on the first electrode, the electrode pattern together with a part of the first electrode forming an electrode pad, and a second electrode provided on the back surface of the semiconductor chip. The electrode pad includes at least first and second portions having mutually differing layer structures disposed on the front surface of the semiconductor chip, and electrically connected to each other, the first and second portions being exposed from the protective film by the opening.

In the embodiment, the first portion has the first electrode and a hard metal film made of a material having a hardness greater than a hardness of a material of the first electrode.

In the embodiment, the hard metal film is in contact with the first electrode and extends along a direction parallel to the front surface of the semiconductor chip.

In the embodiment, the first electrode is a metal film containing aluminum, and the hard metal film is a metal film containing one metal among a metal group of gold, silver, copper, nickel, cobalt, tungsten, molybdenum, titanium, and platinum; or a metal alloy film or a stacked metal film, containing at least one metal in the metal group.

In the embodiment, the first electrode is an elementary aluminum film, or an aluminum alloy film containing silicon or copper.

In the embodiment, the hard metal film is provided on a surface of the first portion.

In the embodiment, the hard metal film extends within the first portion.

In the embodiment, the hard metal film is provided between the first portion and the semiconductor chip.

In the embodiment, the hard metal film is disposed symmetrically with respect to a center of the semiconductor chip as a reference, along at least one direction parallel to the front surface of the semiconductor chip.

In the embodiment, the first portion is a pad portion that is connectable to a metal contact for passing a predetermined current in the semiconductor chip when electrical characteristics of the element structure are inspected.

In the embodiment, of the electrode pad disposed within the opening, the second portion excluding the first portion has only the first electrode.

In the embodiment, the second portion is a pad portion where a wire containing aluminum or copper is to be bonded.

In the embodiment, the wire is a plurality of fine metal wires or a ribbon-shaped conductor.

In the embodiment, the protective film is a polyimide film, a silicon nitride film, or a silicon oxide film.

In the embodiment, the semiconductor chip contains silicon carbide.

According to another embodiment of the invention, a method of inspecting the semiconductor device above includes an inspection process of inspecting electrical characteristics of the element structure by contacting and electrically connecting a metal contact with the first portion of the electrode pad and passing current through the semiconductor chip via the metal contact.

In the embodiment, in the inspection process, a current of at least 300 A/cm$^2$ is passed through the semiconductor chip.

In the embodiment, the element structure is an insulated gate structure formed by a three-layer structure including a metal, an oxide film, and a semiconductor of an insulated-gate bipolar transistor, the insulated-gate bipolar transistor including a collector region and a drift region that form a parasitic diode, and in the inspection process, the current flows in a forward direction through a pn junction between the collector region and the drift region of the parasitic diode.

In the embodiment, the inspection process is performed plural times.

In the embodiment, the semiconductor chip contains silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Figure 20:
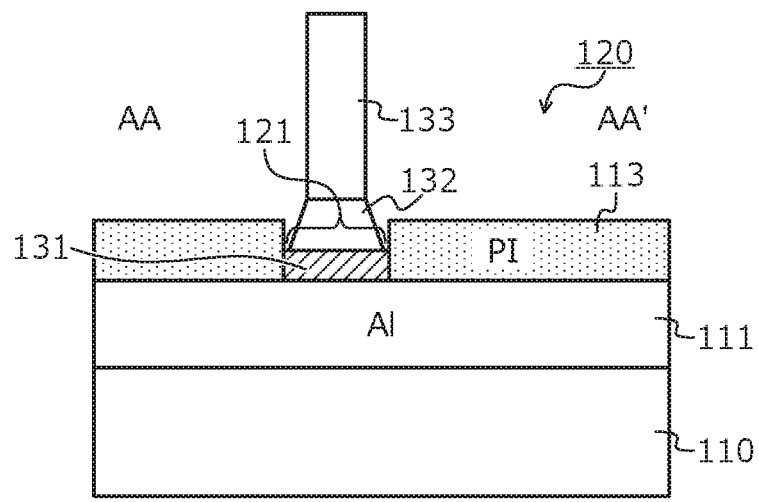
FIG. 20 is a cross-sectional view after mounting of the semiconductor chip depicted in FIG. 18.
Figure 21:
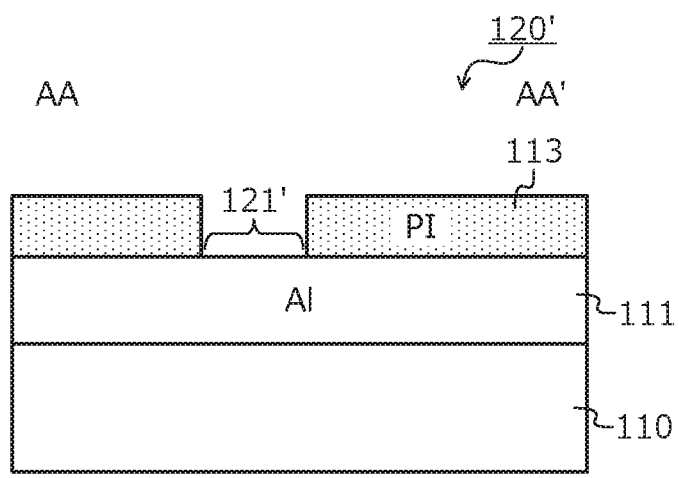
FIG. 21 is a cross-sectional view of another example of the structure along cutting line AA-AA' in FIG. 17.
Figure 22:
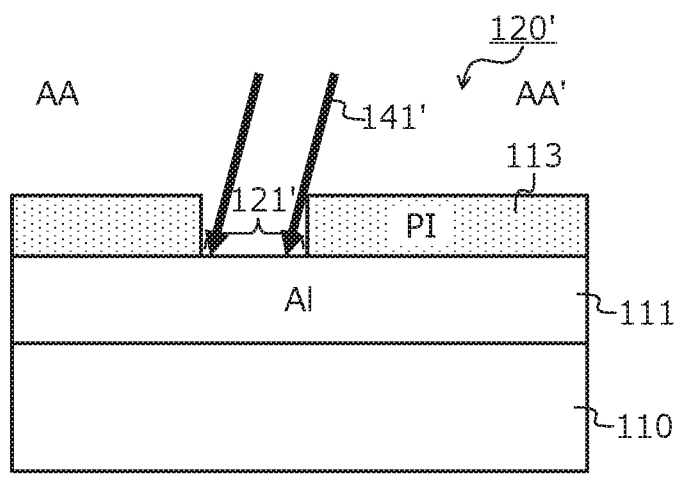
FIG. 22 is a cross-sectional view during screening of the semiconductor chip depicted in FIG. 21.
Figure 23:
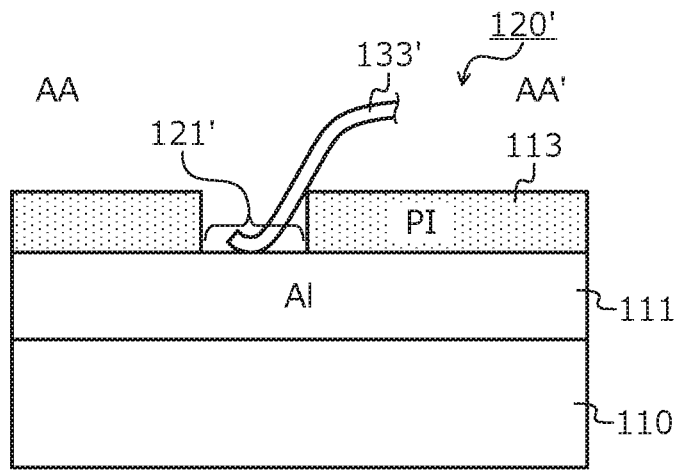
FIG. 23 is a cross-sectional view after mounting of the semiconductor chip in depicted FIG. 21.

First, problems related to the conventional techniques will be described. In performing screening in which large current is passed through the semiconductor chip 110, the surface of the electrode pad has to be covered by a plating film. However, in a semiconductor device that does not use the terminal pin 133 (refer to FIG. 20) such as general discrete parts (semiconductor components having uniform specifications) or the conventional semiconductor device 120' using the Al bonding wire 133' (refer to FIG. 21), the surface of the electrode pad is not covered by a plating film.

A reason for this is that the plating film and the Al bonding wire have poor adhesion, whereby bonding strength of the Al bonding wire is weak. Further, Al, which is a material of the electrode pad, is soft as compared to Ni or Au, which are materials of the plating film. Therefore, during screening, when the electrode pad is pushed against the probe needle by a predetermined pressure and the probe needle reaches an interlayer insulating film beneath the electrode pad, cracks may occur in the electrode pad.

Figure 17:
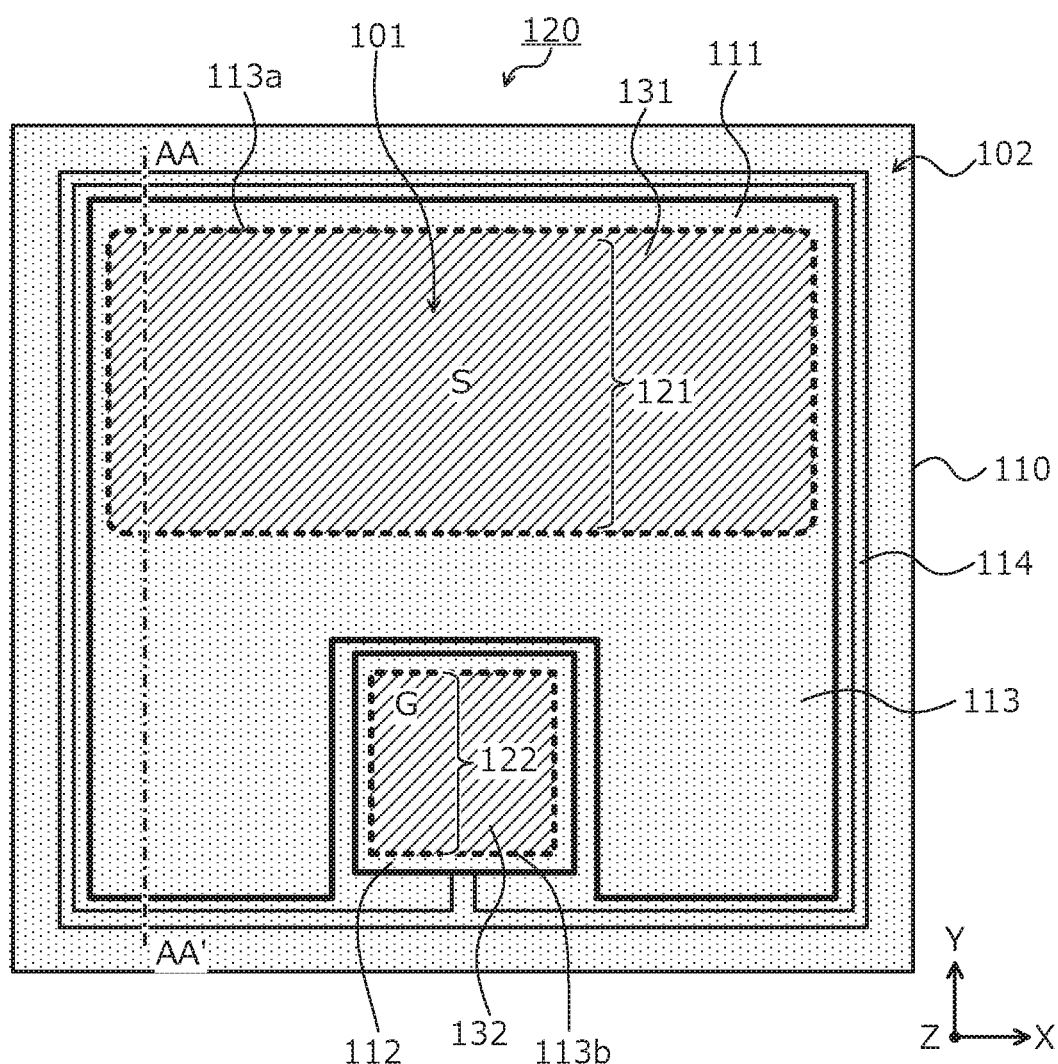
FIG. 17 is a plan view of a layout of a conventional semiconductor device, as viewed from a front surface of a semiconductor chip.
Figure 18:
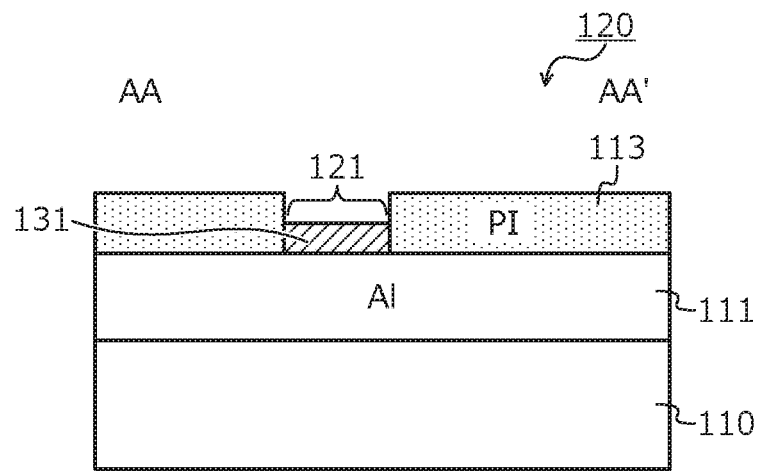
FIG. 18 is a cross-sectional view of a structure along cutting line AA-AA' in FIG. 17.
Figure 19:
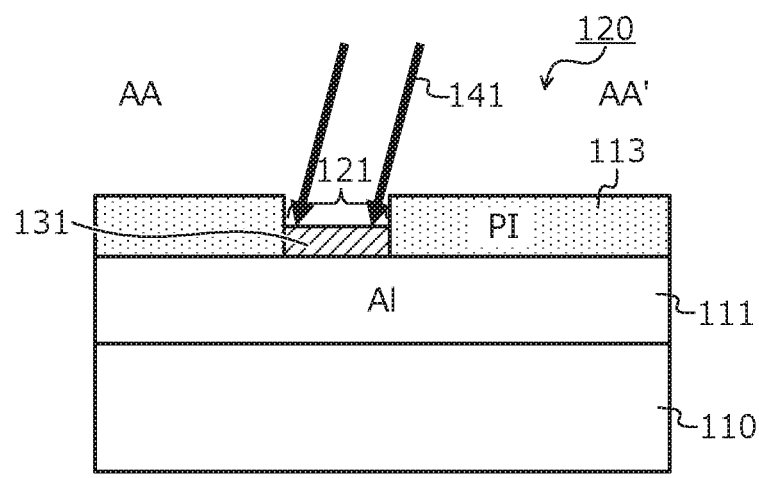
FIG. 19 is a cross-sectional view during screening of the semiconductor chip depicted in FIG. 18.

Thus, in the conventional semiconductor devices (refer to FIGS. 17, 18, 21), it is impossible to use the single source pad 121 in optimal states for two or more means of differing purposes.

Embodiments of a semiconductor device and a method of inspecting a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
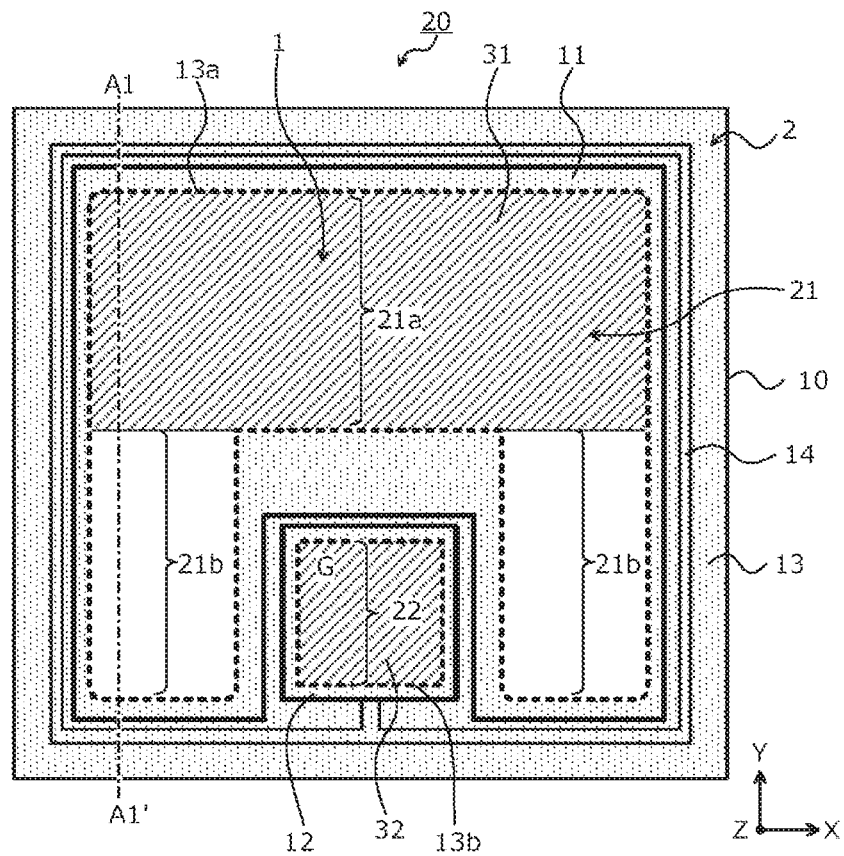
FIG. 1 is a plan view of a semiconductor device according to a first embodiment, as viewed from a front surface of a semiconductor chip.
Figure 2:
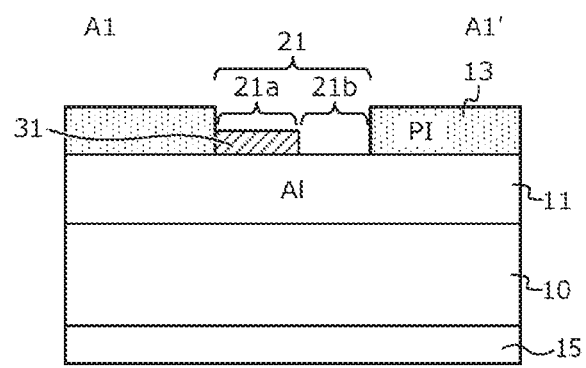
FIG. 2 is a cross-sectional view of a structure along cutting line A1-A1' in FIG. 1.
Figure 3:
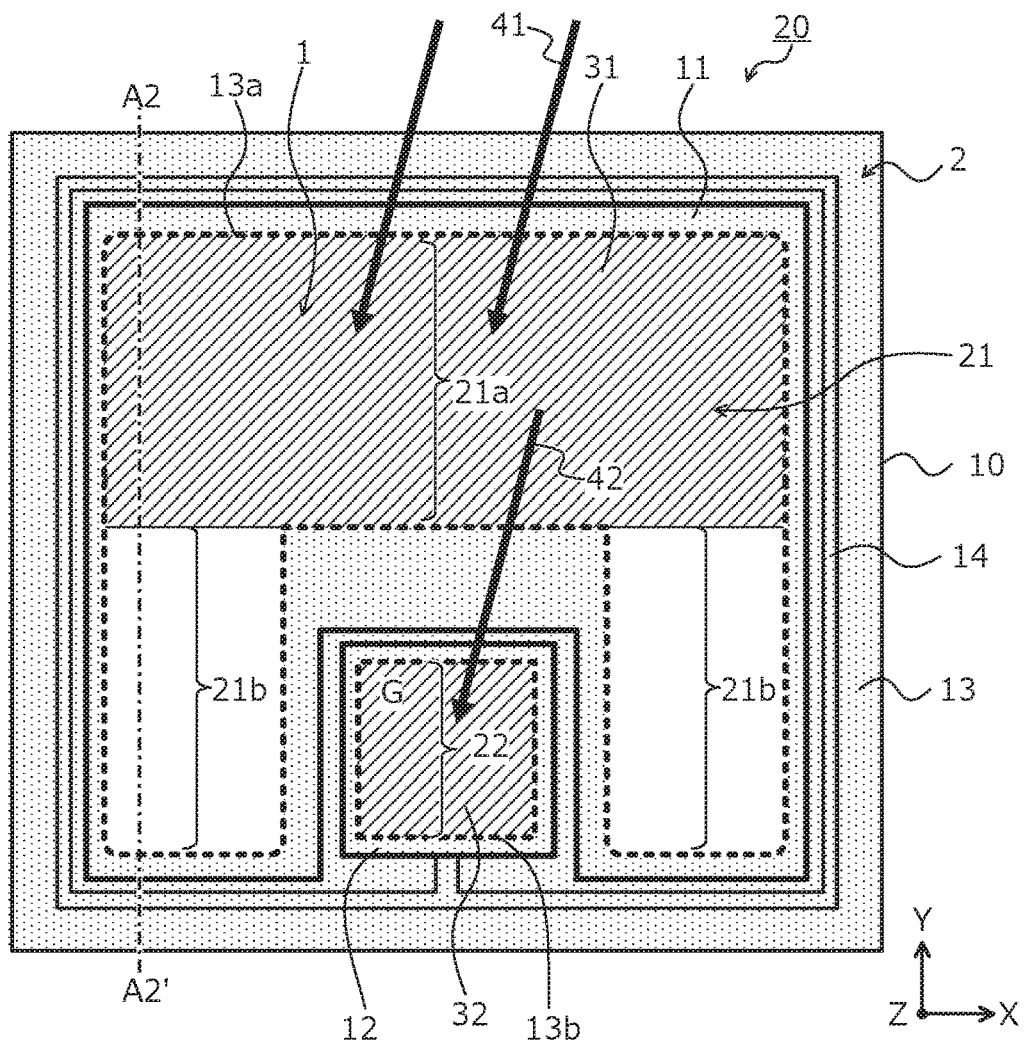
FIG. 3 is a plan view depicting a state during screening of the semiconductor chip depicted in FIG. 1.
Figure 4:
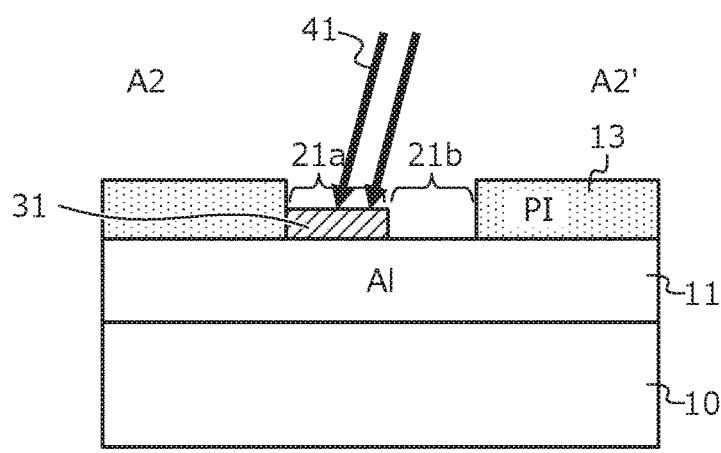
FIG. 4 is a cross-sectional view of a structure along cutting line A2-A2' in FIG. 3.
Figure 5:
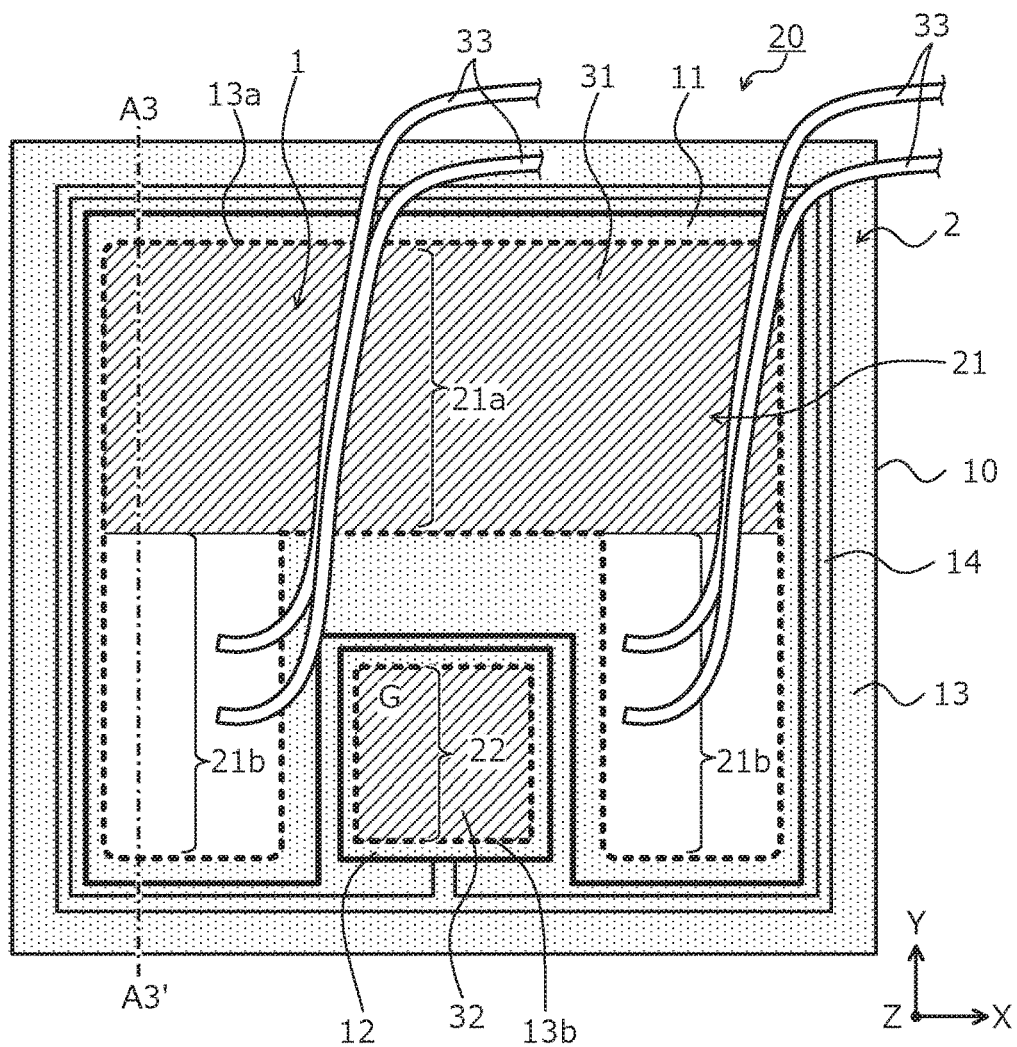
FIG. 5 is a plan view depicting a state after mounting of the semiconductor chip depicted in FIG. 1.
Figure 6:
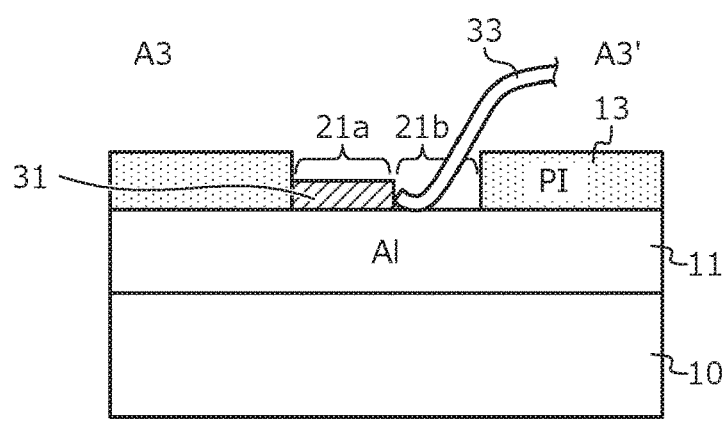
FIG. 6 is a cross-sectional view of a structure along cutting line A3-A3' in FIG. 5.

A structure of the semiconductor device according to a first embodiment will be described taking a vertical MOSFET as an example. FIG. 1 is a plan view of the semiconductor device according to the first embodiment, as viewed from a front surface of a semiconductor chip (semiconductor substrate). FIG. 3 is a plan view depicting a state during screening of the semiconductor chip depicted in FIG. 1. FIG. 5 is a plan view depicting a state after mounting of the semiconductor chip depicted in FIG. 1. FIGS. 2, 4, and 6 are cross-sectional views of structures along cutting line A1-A1' in FIG. 1, cutting line A2-A2' in FIG. 3, and cutting line A3-A3' in FIG. 5, respectively.

In FIGS. 1 to 6, a passivation film (protective film) 13 is indicated by dotted hatching and plating film (electrode pattern) 31 and plating film 32 are indicated by oblique-lined hatching (similarly in FIGS. 12 to 16). In FIGS. 1, 3, and 5, a source electrode (first electrode) 11 and a gate metal layer 12 are indicated by thick lines and openings 13a, 13b of the passivation film 13 are indicated by thick dashed lines (similarly in FIG. 16). In FIGS. 2, 4, and 6, an element structure in a semiconductor chip 10 and an interlayer insulating film provided between the semiconductor chip 10 and the source electrode 11 are not depicted (similarly in FIGS. 7 to 13).

A semiconductor device 20 according to the first embodiment and depicted in FIGS. 1 and 2 includes, in an active region 1, at a front surface of the semiconductor chip 10, a source pad (electrode pad) 21 that includes a portion of the source electrode 11 and a gate pad (electrode pad) 22 that includes a portion of the gate metal layer 12. The active region 1 is a region in which a main current flows when the MOSFET is in an ON state. In the active region 1, unit cells (functional units of an element) of the MOSFET are disposed.

A periphery of the active region 1 is surrounded by an edge termination region 2. The edge termination region 2 is a region between the active region 1 and a side surface of the semiconductor chip 10, mitigating electric field on front surface side of the semiconductor chip 10 and sustaining breakdown voltage. In the edge termination region 2, a gate runner 14 containing a poly-silicon (poly-Si) and/or a predetermined voltage withstanding structure (not depicted) is disposed. The breakdown voltage is a voltage limit at which no destruction or errant operation of an element occurs.

A semiconductor material of the semiconductor chip 10 may be, for example, silicon (Si) or silicon carbide (SiC). In the active region 1, on the front surface side of the semiconductor chip 10, a general MOS gate structure (not depicted) of the MOSFET is provided. The interlayer insulating film (not depicted) is provided on the front surface of the semiconductor chip 10 overall. The interlayer insulating film covers gate electrodes (not depicted) configuring the MOS gate structure.

The source electrode 11 and the gate metal layer 12 are provided are separated from each other on the interlayer insulating film. The source electrode 11, via contact holes (not depicted) penetrating through the interlayer insulating film in a depth direction, is electrically connected to a source region and a base region configuring the MOS gate structure. The source electrode 11 is disposed in the active region 1, at a portion excluding a portion where the gate metal layer 12 is disposed and occupies most of a mathematical area of the active region 1.

The source electrode 11, for example, has a substantially rectangular planar shape that has a portion recessed inwardly (toward a center of the semiconductor chip 10) so as to surround three sides of the gate metal layer 12 that has a substantially rectangular planar shape. The source electrode 11 and the gate metal layer 12, for example, have similar stacked structures and are disposed at a same level. The source electrode 11 and the gate metal layer 12 are metal layers containing aluminum (Al), indicated in FIG. 2 as "Al" (similarly in FIGS. 4, 6, and 7 to 15).

In particular, a material of the source electrode 11 and the gate metal layer 12, for example, may be an Al alloy containing aluminum (Al) such as aluminum-silicon (AlSi) or aluminum-silicon-copper (AlSiCu), aluminum-copper (AlCu), etc. or may be pure Al having a purity of at least 99.9%. The source electrode 11 and the gate metal layer 12 are covered by the passivation film 13. The source electrode 11 and the gate metal layer 12 are electrically insulated from each other by the passivation film 13.

A portion of the source electrode 11 exposed by the opening 13a of the passivation film 13 is used as a portion of the source pad 21. A portion of the gate metal layer 12 exposed in the opening 13a of the passivation film 13 is used as the gate pad 22. A material of the passivation film 13, for example, may be a polyimide (PI) or silicon nitride (SiN), a silicon oxide ($SiO_2$), or may be SiN and $SiO_2$ from a viewpoint of ease of manufacturing processes when the source pad 21 is formed.

The source pad 21 may have a planar shape similar to that of the source electrode 11 with a surface area smaller than that of the source electrode 11. In FIG. 1, the source pad 21 is depicted having a substantially C-shaped planar shape formed by a first portion 21a described hereinafter and disposed singularly, extending in a direction (hereinafter, first direction) X parallel to the front surface of the semiconductor chip 10, and two second portions 21b described hereinafter and continuous with the first portion 21a at differing positions and extending in an identical direction that is parallel to a direction (hereinafter, second direction) Y that is a direction parallel to the front surface of the semiconductor chip 10 and orthogonal to the first direction X.

A portion (hereinafter, the first portion) 21a of the source pad 21 includes a metal film formed by a material that is harder than that of the source electrode 11. The metal film extends in a direction parallel to the front surface of the semiconductor chip and spans the first portion 21a of the source pad 21 overall. In particular, the first portion 21a of the source pad 21, as the metal film formed by a material that is harder than that of the source electrode 11, for example, has the plating film 31 that covers a surface of the first portion 21a overall. The plating film 31 on the first portion 21a of the source pad 21 is in contact with a probe needle 41 that is a metal contact during screening (FIGS. 3, 4).

"Hardness" is "indentation hardness" expressed as a surface area or depth (indentation depth) of a recess formed when the probe needle 41 is pushed or "hardness" is expressed as a load, etc. when the probe needle 41 is pushed to reach a predetermined indentation depth, and indicates a resistance to indentation or an amount of damage to a lower structure (interlayer insulating film, silicon portion, etc.). "Hardness", for example, may be "Vickers hardness" expressed as a quotient obtained by dividing a load by a surface area calculated based on diagonals of an indentation formed by pushing a quadrangular-pyramid-shaped diamond into a test subject.

The plating film 31, for example, may be a metal film containing gold (Au), silver (Ag), copper (Cu), nickel (Ni), cobalt (Co), tungsten (W), molybdenum (Mo), titanium (Ti), or platinum (Pt), or may be a stacked metal film or a metal alloy film containing these metals. When the plating film 31 is a stacked film, the plating film 31, for example, may be a stacked film in which a plating film of a metal (for example, Au) resistant to oxidation is stacked on a Ni plating film. Instead of the plating film 31, for example, a film deposited by sputtering or chemical vapor deposition (CVD) may be used.

Indentations (probe marks) formed when the probe needle 41 is pushed into the plating film 31 are left of a number equal to a number of times that the probe needle 41 makes contact. An assembly process after the inspection process may be performed in state in which the plating film 31 is exposed at the surface of the first portion 21a of the source pad 21 or may be performed after the surface of the plating film 31 is covered by a polyimide film after screening. The polyimide film, for example, may be formed by applying a polyimide to the surface of the plating film 31 by an inkjet method.

Portions (hereinafter, second portions) 21b of the source pad 21 other than the first portion 21a have a layer structure different from the first portion 21a of the source pad 21. In particular, the second portions 21b of the source pad 21 include only the source electrode 11 that is formed by a material having high adhesion with a bonding wire 33, and the surface thereof is not covered by a plating film. After the inspection process of the semiconductor chip 10, the bonding wire 33 is bonded to the second portions 21b of the source pad 21 by wire-bonding (ultrasonic bonding) (FIGS. 5, 6).

The first and the second portions 21a, 21b of the source pad 21 are disposed adjacently to each other and are electrically connected to each other by the opening 13a provided singularly in the passivation film 13, and are not separated by the passivation film 13. In other words, the source pad 21 has a structure in which, at the opening 13a provided singularly in the passivation film 13, in a direction (the first or the second direction X, Y; in FIG. 1, the second direction Y) parallel to the front surface of the semiconductor chip 10, two metal layers (the first and the second portions 21a, 21b) having mutually differing layer structures are adjacent to each other and are electrically connected to each other.

The plating film 31 of the first portion 21a of the source pad 21, in the opening 13a provided singularly in the passivation film 13, may be disposed symmetrically, relative to a center of the semiconductor chip 10 as a reference, along at least one direction (the first direction X or the second direction Y, or both directions) parallel to the front surface of the semiconductor chip 10. FIG. 1 depicts a case in which the plating film 31 is disposed symmetrically along the first direction X. By disposing the plating film 31 symmetrically along the first and/or the second directions X, Y of the semiconductor chip 10, an unbalance of current flowing at the surface of the semiconductor chip 10 may be eliminated, which is particularly useful when large current flows in the semiconductor chip 10.

The gate pad 22 may have a shape similar to the planar shape of the gate metal layer 12 and may have a planar shape having a surface area smaller than that of the gate metal layer 12. For example, in FIG. 1, the gate pad 22 having a substantially rectangular planar shape is depicted. The gate pad 22 contains a material that is harder than a material of the gate metal layer 12. In particular, a surface of the gate pad 22 overall is covered by the plating film 32. A configuration of the plating film 32, for example, is similar to that of the plating film 31. During screening, a probe needle 42 is in contact with and electrically connected to the plating film 32 of the gate pad 22.

In the active region 1, directly beneath the gate pad 22, for example, is a region not functioning as the MOSFET and no unit cells of the MOSFET are disposed therein. The gate runner 14 is electrically connected to the gate pad 22 via the gate metal layer 12. The gate runner 14 is provided in the edge termination region 2, along a border between the edge termination region 2 and the active region 1, and surrounds a periphery of the active region 1. The gate electrodes configuring the MOS gate structure are electrically connected to the gate runner 14. At a back surface of the semiconductor chip 10, a drain electrode (second electrode) 15 also acting as a drain pad is provided.

Figure 7:
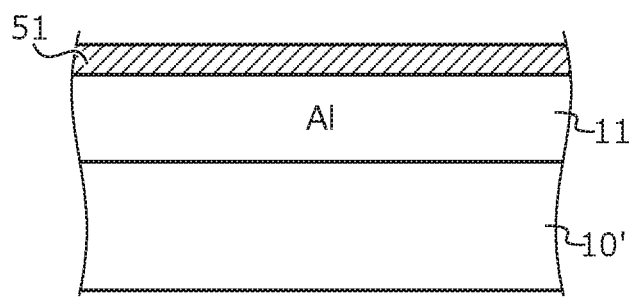
FIG. 7 is a cross-sectional view of the semiconductor device according to the first embodiment during manufacture.
Figure 8:
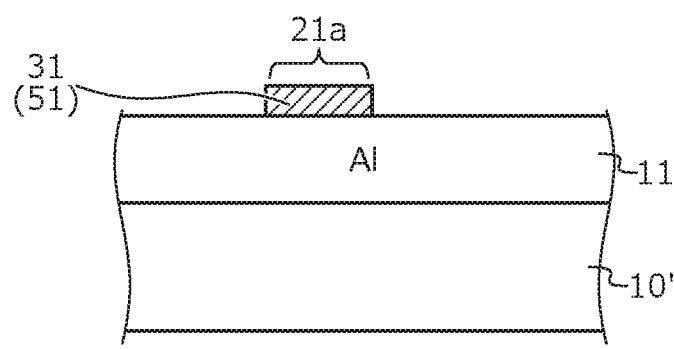
FIG. 8 is a cross-sectional view of the semiconductor device according to the first embodiment during manufacture.

A method of manufacturing the semiconductor device 20 according to the first embodiment (hereinafter, first method of manufacture) will be described. FIGS. 7 and 8 are cross-sectional views of the semiconductor device according to the first embodiment during manufacture. FIGS. 7 and 8 depict, in a semiconductor wafer (semiconductor substrate) 10', a vicinity of the source pad 21 of a region (hereinafter, chip region) becoming the semiconductor chip 10 (refer to FIG. 1) after dicing (cutting) (similarly in FIGS. 9 to 13). Configuration other than that near the source pad 21 will be described with reference to FIG. 1.

First, in the active region 1 of each chip region of the semiconductor wafer 10', at a front surface side of the semiconductor wafer 10', the MOS gate structure (not depicted) is formed and in the edge termination region 2, on a front surface of the semiconductor wafer 10', the gate runner 14 is formed via a field oxide film (not depicted). At this time, gate electrodes configuring the MOS gate structure are electrically connected to the gate runner 14.

Next, the interlayer insulating film (not depicted) is formed on the front surface of the semiconductor wafer 10', covering the gate runner 14 and the gate electrodes (not depicted) configuring the MOS gate structure. Next, a contact hole is formed in the interlayer insulating film and the source electrode 11 is formed on the interlayer insulating film so as to be embedded in the contact hole. At this time, the source electrode 11 is electrically connected to the source region and the base region configuring the MOS gate structure.

Further, the gate metal layer 12 is formed on the interlayer insulating film. The gate metal layer 12 is electrically connected to the gate runner 14. The source electrode 11 and the gate metal layer 12, for example, may be concurrently formed by patterning and separating a single metal film (Al alloy film or Al film) formed on interlayer insulating film.

Next, as depicted in FIG. 7, on the front surface of the semiconductor wafer 10' overall, a plating film 51 is formed using a metal material that is harder than a material of the electrode pad and is formed so as to cover the surface of the electrode pad (the source electrode 11 and the gate metal layer 12) overall. Instead of the plating film 51, for example, a deposited film may be formed by sputtering or CVD.

Next, as depicted in FIG. 8, by photolithography and, for example, wet etching, the plating film 51 is selectively removed, leaving of the plating film 51, only portions that become the plating films 31, 32. In particular, a portion of the plating film 51 covering the surface the first portion 21a of the source pad 21 overall is left on the source electrode 11 as the plating film 31. A portion of the plating film 51 covering the surface of the gate pad 22 overall is left on the gate metal layer 12 as the plating film 32.

Next, the front surface of the semiconductor wafer 10' overall is covered by the passivation film 13. Next, by photolithography and etching, the passivation film 13 is selectively removed, thereby forming the openings 13a, 13b in the passivation film 13. The first portion 21a of the source pad 21 (the plating film 31) and the second portions 21b are exposed by the opening 13a of the passivation film 13 and the gate pad 22 (the plating film 32) is exposed by the opening 13b.

Next, the semiconductor wafer 10' is diced (cut) into individual chips (the semiconductor chip 10), whereby the semiconductor device 20 according to the first embodiment is completed.

Next, an inspection process (including screening) that confirms electrical characteristics of the semiconductor chip 10 and checks for defects is performed. In particular, the semiconductor chip 10 is placed on a conductive stage (not depicted) of an inspection apparatus and the first portion 21a of the source pad 21 and the gate pad 22 are pushed by a predetermined pressure to be in contact with and thereby, electrically connected to the probe needles 41, 42, respectively.

Subsequently, via the probe needles 41, 42, voltage is applied to the source pad 21 and the gate pad 22 under predetermined conditions, respectively and a current of, for example, at least 300 A/cm$^2$ is passed between the source and the drain, whereby the electrical characteristics (for example, ON voltage Von) of the MOSFET are measured (FIGS. 3, 4). For example, the ON voltage Von of the MOSFET may be measured before and after screening, whereby temporal changes ΔVon of the ON voltage Von of the MOSFET may be calculated.

Contact sites of the electrode pads (the source pad 21 and the gate pad 22) with the probe needles 41, 42 are covered by the plating films 31, 32 that are formed by a material that is harder than the material of the electrode pads. Therefore, the probe needles 41, 42 may be prevented from penetrating through the electrode pads and reaching a layer therebelow (interlayer insulating film, etc.). Further, contact resistance of the probe needles 41, 42 and the plating films 31, 32 is low and therefore, large current may be passed in the semiconductor chip 10.

For example, when a material of the semiconductor chip 10 is silicon carbide (SiC), screening has to be performed passing a large current through the semiconductor chip 10, however, since the chip size is small, the number of the probe needles 41 to be pushed into the source pad 21 is difficult to increase. Therefore, the plating film 31 provided on the surface of the first portion 21a of the source pad 21 is useful.

Further, current may be passed through a parasitic diode formed by a pn junction between the base region and a drift region of the MOSFET and forward degradation of the parasitic diode may be confirmed. When a material of the semiconductor chip 10 is SiC, during screening of a sample (test specimen) for confirming forward degradation of the parasitic diode, current 1 to 5 times a rated current is passed through the semiconductor chip 10. Therefore, the plating film 31 provided on the surface of the first portion 21a of the source pad 21 is useful.

In an instance where a material of the semiconductor chip 10 is silicon (Si), when screening is performed passing a large current through the semiconductor chip 10, the plating film 31 provided on the surface of the first portion 21a of the source pad 21 is useful. Plural probe needles 41 may be put in contact with the first portion 21a of the source pad 21. The inspection process may be performed by the state of the semiconductor wafer 10'. After this inspection process and before product shipment, a further inspection process may be performed at a predetermined timing.

Next, by a general assembly process, the semiconductor chip 10 is mounted on a circuit pattern of a mounting substrate. Next, the bonding wire 33 is wire bonded to the second portions 21b of the source pad 21 of the front surface of the semiconductor chip 10, thereby electrically connecting the source pad 21 and, for example, the lead frame (not depicted) (FIGS. 5, 6).

The bonding wire 33, for example, may be a fine metal wire containing a Cu alloy or an Al alloy such as AlSi or AlSiCu, AlCu, etc., or may be a fine metal wire containing pure Cu or pure Al of a purity of at least 99.9%. Instead of the bonding wire 33, ribbon wire (ribbon-shaped conductor) having a width wider than that of bonding wire may be used. Use of the bonding wire 33 in plural or use of ribbon wire, enables fabrication of a module having a structure in which large current flows in the semiconductor device 20 according to the first embodiment.

Thereafter, the semiconductor chip 10 is sealed, whereby a module in which the semiconductor device 20 according to the first embodiment is mounted is completed.

Figure 9:
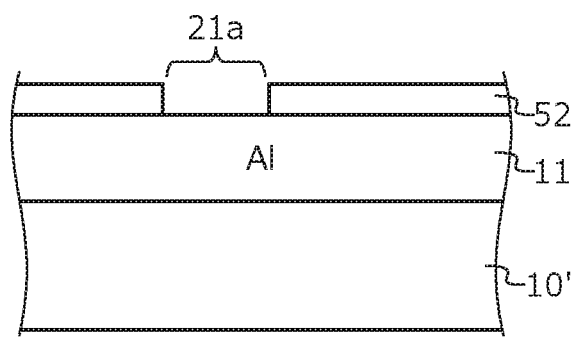
FIG. 9 is a cross-sectional view of another example of the semiconductor device according to the first embodiment during manufacture.
Figure 10:
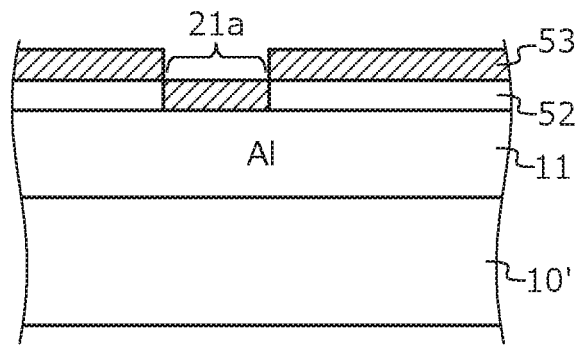
FIG. 10 is a cross-sectional view of the other example of the semiconductor device according to the first embodiment during manufacture.
Figure 11:
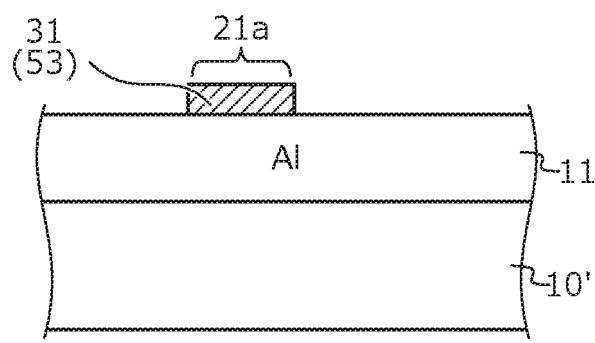
FIG. 11 is a cross-sectional view of the other example of the semiconductor device according to the first embodiment during manufacture.

Another example (hereinafter, second method of manufacture) of the method of manufacturing the semiconductor device 20 according to the first embodiment will be described. FIGS. 9, 10, and 11 are cross-sectional views of another example of the semiconductor device according to the first embodiment during manufacture. In the second method of manufacture, first, similarly to the first method of manufacture, in each chip region of the semiconductor wafer 10', the processes through forming the source electrode 11 and the gate metal layer 12 are sequentially performed.

Next, as depicted in FIG. 9, on the semiconductor wafer 10', a resist mask 52 opened at formation regions of the first portion 21a of the source pad 21 and of the gate pad 22 is formed. Next, as depicted in FIG. 10, for example, by sputtering, on the front surface of the semiconductor wafer 10' overall, a metal film 53 is formed using a material having a hardness greater than that of materials used in the electrode pads (the source electrode 11 and the gate metal layer 12).

When formed by CVD, the metal film 53 is formed in the openings of the resist mask 52 and on the surface of the resist mask 52 (FIG. 10). When the metal film 53 is formed by a plating process, the surface of the resist mask 52 is not plated and therefore, the metal film 53 is formed only on the surfaces of the electrode pads exposed by the openings of the resist mask 52. Herein, a case in which the metal film 53 is formed by CVD will be described as an example.

Next, as depicted in FIG. 11, the resist mask 52 is removed and together with the resist mask 52, the metal film 53 on the resist mask 52 is removed (liftoff). As a result, of the metal film 53, only the portions becoming the plating films 31, 32 are left on the surface of the first portion 21a of the source pad 21 and on the surface of the gate pad 22, respectively. Thereafter, similarly to the first method of manufacture, formation of the passivation film 13 and subsequent processes are sequentially performed, whereby a module in which the semiconductor device 20 according to the first embodiment is mounted is completed.

Figure 12:
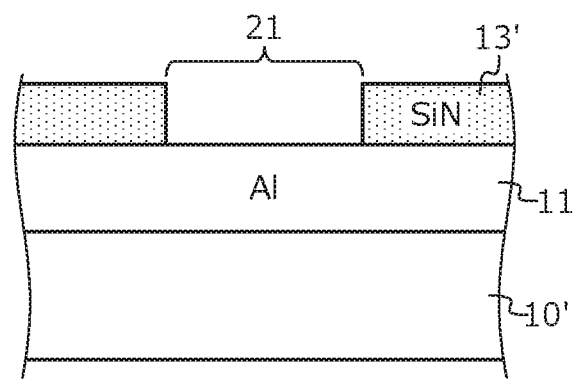
FIG. 12 is a cross-sectional view of another example of the semiconductor device according to the first embodiment during manufacture.
Figure 13:
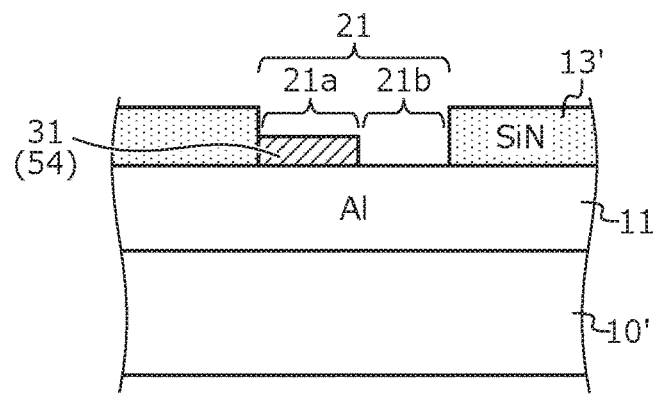
FIG. 13 is a cross-sectional view of the other example of the semiconductor device according to the first embodiment during manufacture.

Another example (hereinafter, third method of manufacture) of the method of manufacturing the semiconductor device 20 according to the first embodiment will be described. FIGS. 12 and 13 are cross-sectional views of another example of the semiconductor device according to the first embodiment during manufacture. The third method of manufacture differs from the first method of manufacture in that a material of the passivation film 13 is limited to SiN or $SiO_2$.

In the third method of manufacture, a material of the passivation film 13, for example, is SiN or $SiO_2$, which have a heat resistance of at least 1000 degrees C., are chemically stable, and are not removed by resist development, stripping solution, etc. Therefore, the degree of freedom in the sequence of the manufacturing processes increases. In particular, formation processes of the passivation film 13 and the plating films 31, 32 may be interchanged.

More specifically, first, similarly to the first method of manufacture, in each of the chip regions of the semiconductor wafer 10', processes through formation of the source electrode 11 and the gate metal layer 12 are sequentially performed. Next, as depicted in FIG. 12, on the front surface of the semiconductor wafer 10' overall, the passivation film 13 is formed using SiN as a material.

Next, by photolithography and dry etching, the passivation film 13 is selectively removed, thereby forming the openings 13a, 13b in the passivation film 13. The source pad 21 and the gate pad 22 are exposed by the openings 13a, 13b of the passivation film 13, respectively.

Next, as depicted in FIG. 13, on the front surface of the semiconductor wafer 10', a plating film 54 is formed. Instead of the plating film 54, for example, a deposited film may be formed by sputtering or CVD. Next, by photolithography and etching, the plating film 54 is selectively removed, leaving of the plating film 51, only portions that become the plating films 31, 32.

Thereafter, similarly to the first method of manufacture, dicing of the semiconductor wafer 10' and subsequent processes are sequentially performed, whereby a module in which the semiconductor device 20 according to the first embodiment is mounted is completed.

As described above, according to the first embodiment, the source pad exposed by a single opening of the passivation film has the first and the second portions of mutually differing layer structures configured according to purpose. Therefore, a single source pad may be used optimally in two or more means having mutually differing purposes. For example, the source pad may be structured to have the first portion that is made harder than other portions by providing a plating film on the surface of the source electrode and the second portions that include only the source electrode and have a layer structure that differs from that of the first portion.

The first portion of the source pad is used as an inspection pad portion that the probe needle of the inspection apparatus contacts during the inspection process. The plating film that is harder than the source electrode is provided in the first portion of the source pad and therefore, the probe needle that contacts the first portion of the source pad may be prevented from reaching the interlayer insulating film below. Further, the plating film of the first portion of the source pad has a low contact resistance with the probe needle and enables large current to be passed through the semiconductor chip during the inspection process and thereby, enables an outflow of defective chips in products with high current flow specifications to be prevented.

The second portions of the source pad are used as electrode pads to which bonding wires are bonded during the assembly process. The second portions of the source pad include only the source electrode that is formed using a metal having high adhesion with the bonding wires. As a result, the bonding strength between the source pad and the bonding wire may be increased. Therefore, as compared to the conventional structure (refer to FIG. 17) in which a plating film is provided on the surface of the source pad overall, the lifespan such as in a power cycling test may be enhanced.

Figure 14:
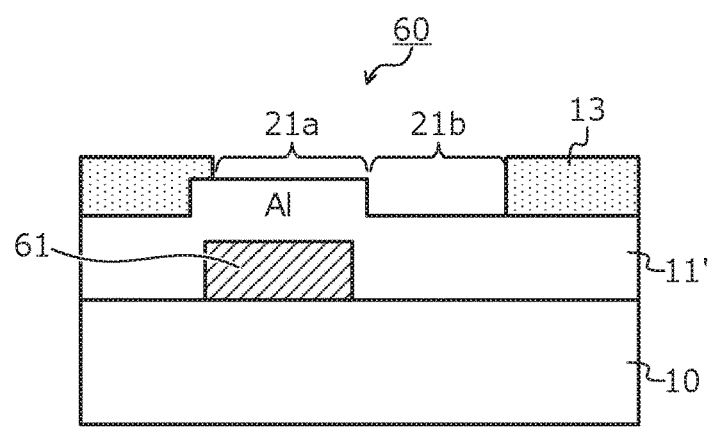
FIG. 14 is a cross-sectional view of an example of a structure of the semiconductor device according to a second embodiment.
Figure 15:
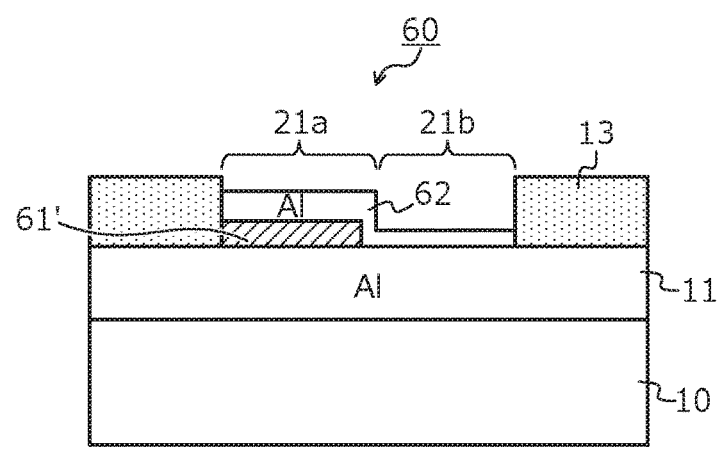
FIG. 15 is a cross-sectional view of an example of a structure of the semiconductor device according to the second embodiment.

A structure of the semiconductor device according to a second embodiment will be described. FIGS. 14 and 15 are cross-sectional views of an example of a structure of the semiconductor device according to the second embodiment. The semiconductor device 60 according to the second embodiment differs from the semiconductor device 20 according to the first embodiment in that instead of providing the plating film on the surface of the first portion 21a of the source pad 21, metal films 61, 61' formed using a material that is harder than that of the source electrode 11 are provided in the first portion 21a of the source pad 21 or a lower layer thereof.

In particular, in the second embodiment, as depicted in FIG. 14, the first portion 21a of the source pad 21 has a portion of a source electrode 11' and the metal film (electrode pattern) 61 between the semiconductor chip 10 and the source electrode 11'. The second portions 21b of the source pad 21 has only a portion of the source electrode 11' and does not have the metal film 61. In this case, a method of manufacturing the semiconductor device 60 according to the second embodiment includes in the method of manufacturing the semiconductor device 20 according to the first embodiment, before formation of the source electrode 11', formation of the metal film 61 on the front surface of the semiconductor chip 10 and the formation of the source electrode 11' so as to cover the metal film 61.

Further, as depicted in FIG. 15, the first portion 21a of the source pad 21 may include a portion of the source electrode 11, and sequentially stacked on the source electrode 11, the metal film 61' that has a harness greater than that of a material of the source electrode 11, and a metal film (electrode pattern) 62 containing aluminum. The second portions 21b of the source pad 21 has the source electrode 11 alone or the source electrode 11 and the metal film 62 and does not have the metal film 61'. In this case, a method of manufacturing the semiconductor device 60 according to the second embodiment includes in the method of manufacturing the semiconductor device 20 according to the first embodiment, forming the metal films 61', 62 on the source electrode 11.

A material of the metal films 61, 61', for example, is similar to the material of the plating film 31 of the first embodiment. A material of the metal film 62, for example, may be an Al alloy such as AlSi or AlSiCu, AlCu, etc., or may be pure Al of a purity of at least 99.9%. While not depicted, the gate pad 22, similarly to the first portion 21a of the source pad 21, may be formed concurrently with the first portion 21a of the source pad 21 as a stacked layer structure including the metal film 61 or the metal films 61', 62.

As described above, according to the second embodiment, even when the metal film formed using a material that is harder than that of the source electrode is provided in the first portion of the source pad or a lower layer thereof, effects similar to those of the first embodiment may be obtained.

Figure 16:
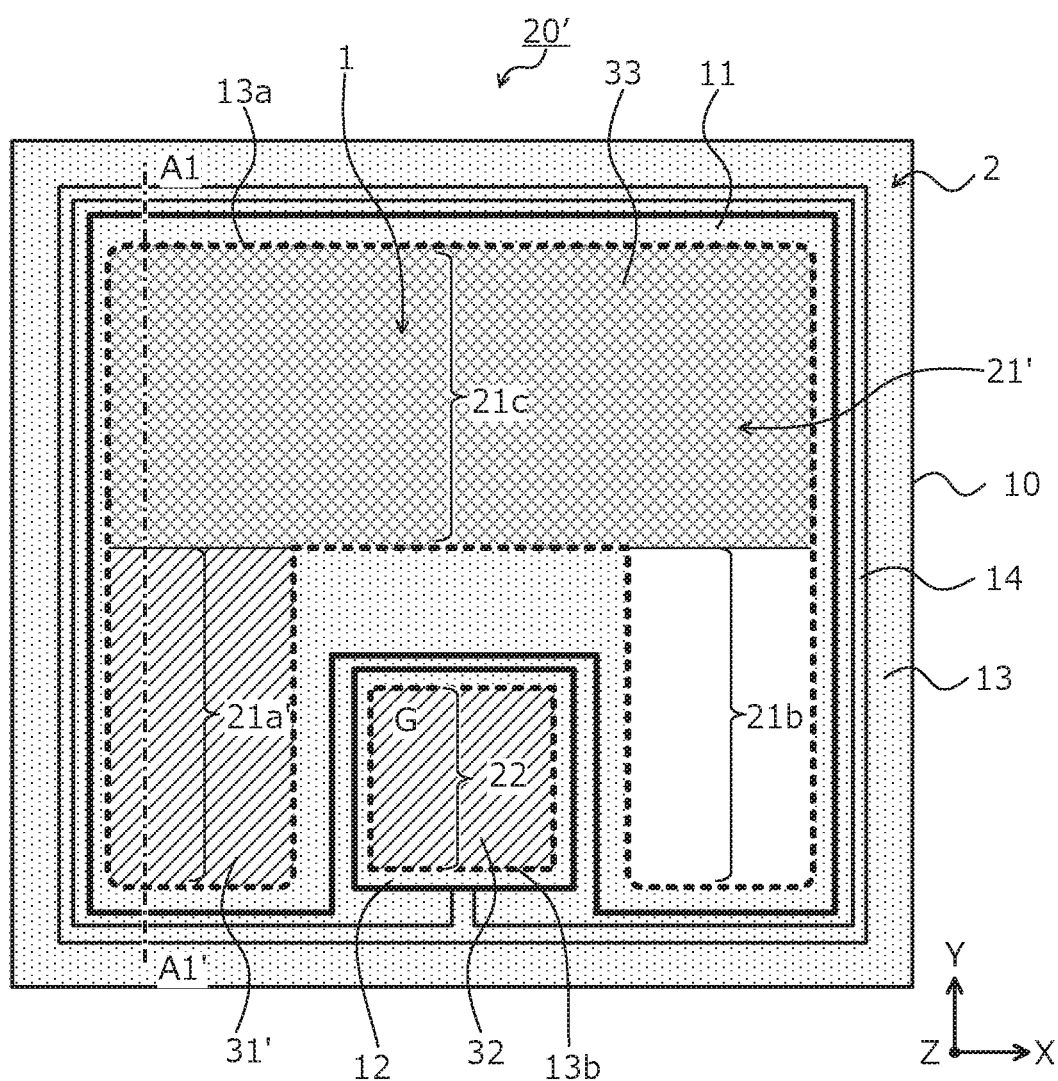
FIG. 16 is a cross-sectional view of a structure of the semiconductor device according to a third embodiment.

A structure of the semiconductor device according to a third embodiment will be described. FIG. 16 is a cross-sectional view of the structure of the semiconductor device according to the third embodiment. A semiconductor device 20' according to the third embodiment differs from the semiconductor device 20 according to the first embodiment in that the source pad 21' has a structure in which, at the opening 13a provided singularly in the passivation film 13, in a direction (the first or the second direction X, Y; in FIG. 1, the second direction Y) parallel to the front surface of the semiconductor chip 10, three or more metal layers having mutually differing layer structures are adjacent to each other and are electrically connected to each other.

For example, an example of a case in which the source pad 21' has three metal layers (first to third portions 21a to 21c) having mutually differing layer structures will be described. In FIG. 16, the source pad 21' is depicted having a substantially C-shaped planar shape formed by the third portion 21c described hereinafter and disposed singularly, extending along the first direction X, and the first and the second portions 21a, 21b described hereinafter and continuous with the third portion 21c at differing positions and extending in an identical direction parallel to the second direction Y.

On the surface of the first portion 21a of the source pad 21', the plating film 31' having a material (for example, Ni or W) that is harder than that of the source electrode 11 is provided. Similarly to the first embodiment, during screening, the probe needle 41 is in contact with and electrically connected to the plating film 31' on the first portion 21a of the source pad 21'.

A layer structure and function of the second portions 21b of the source pad 21' are similar to those in the first embodiment. For example, the bonding wires 33 that become signal lines for measuring (sensing) current (or voltage) occurring when voltage (or current) is forced (forced application) at a predetermined point in the semiconductor chip 10 are wire bonded to the second portions 21b of the source pad 21'.

The third portion 21c of the source pad 21' is a portion of the source pad 21' other than the first and the second portions 21a, 21b and, for example, has a surface area that is larger than that of the first and the second portions 21a, 21b of the source pad 21'. On the surface of the third portion 21c of the source pad 21', for example, a deposited film having Cu, Au, or Ni as a material is provided.

After the inspection process (including screening) of the semiconductor chip 10, a pin-shaped wiring member (terminal pin, not depicted) is soldered to the third portion 21c of the source pad 21', in an upright state substantially orthogonal to the front surface of the semiconductor chip 10. The terminal pin is, for example, a round-bar shaped (cylindrical) external connection terminal for leading out electric potential of the source pad 21' to an external destination.

As described above, according to the third embodiment, even in the source pad having three or more metal layers having mutually differing layer structures, effects similar to those of the first and the second embodiments may be obtained.

In the foregoing, in the present invention without limitation to the embodiments described above, various modifications within a range not departing from the spirit of the invention are possible. For example, in the embodiments described above, while as an example, a case has been described in which the first portion of the source pad is used as an inspection pad portion where the probe needle comes into contact during the inspection process and the second portions of the source pad are used as pad portions where wires are bonded during the assembly process, the first and the second portions of the source pad may be used in mutually differing means of purposes other than these purposes.

Further, in the embodiments described above, while as an example, a case has been described in which the MOSFET is formed on the semiconductor chip, instead of the MOSFET, another MOS-type semiconductor device such as insulated gate bipolar transistors (IGBT, refer to FIG. 24), or a diode may be formed on the semiconductor chip. Further, on a single semiconductor chip, plural semiconductor elements may be formed.

Figure 24:
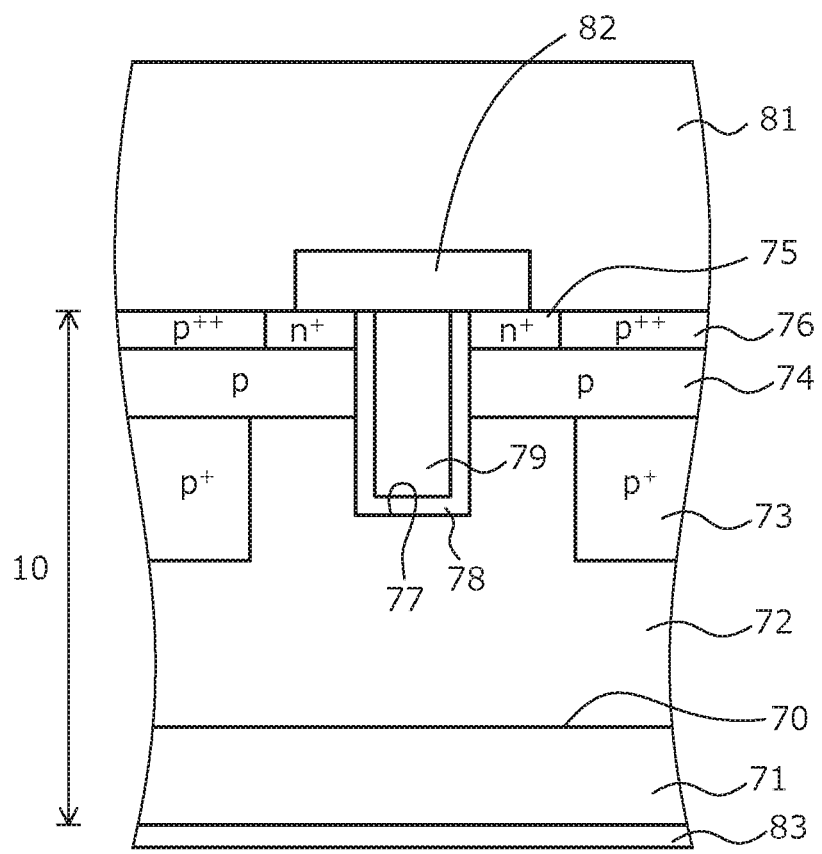
FIG. 24 is a cross-sectional view of an example of an element structure applicable to the semiconductor device according to the first to the third embodiments.

In the embodiments described above, one unit cell of a trench gate IGBT is depicted in FIG. 24 as an example of an element structure when an IGBT is formed on the semiconductor chip 10 (refer to FIGS. 1, 14 to 16) instead of the MOSFET. FIG. 24 is a cross-sectional view of an example of an element structure applicable to the semiconductor device according to the first to the third embodiments. In FIG. 24, while only an interlayer insulating film 82 and a portion excluding an emitter pad of an emitter electrode 81 on the front surface of the semiconductor chip 10 are depicted, the structure of the emitter pad is similar to the structure of the source pad 21 (refer to FIGS. 1, 2, 14 to 16) in the first to the third embodiments.

As depicted in FIG. 24, when the trench gate IGBT is formed on the semiconductor chip 10, a general trench gate structure configured by a $p^+$-type base region 73, a p-type base region 74, an $n^+$-type emitter region 75, a $p^{++}$-type contact region 76, a trench 77, a gate insulating film 78, and a gate electrode 79 is provided on the front side of the semiconductor chip 10, in the active region 1. The emitter electrode 81 is provided on the front surface of the semiconductor chip 10. Portions of the emitter electrode 81 exposed by the openings 13a (refer to FIGS. 1, 2, 14 to 16) of the passivation film 13 are used as the emitter pad (not depicted).

On the back side of the semiconductor chip 10, a p$^+$-type collector region 71 is provided. A drain electrode 83 is provided on the back surface of the semiconductor chip 10 in contact with the p$^+$-type collector region 71. An n$^-$-type drift region 72 is provided in contact with and between the p$^+$-type collector region 71 and, the p$^+$-type base region 73 and the p-type base region 74. In this case, the screening is performed by putting the probe needle in contact with a first portion (corresponds to reference character 21a in FIGS. 1 to 4, 14 to 16) of the emitter pad and passing current through a parasitic diode formed by a pn junction 70 between the p$^+$-type base region 73, the p-type base region 74, and the n$^-$-type drift region 72.

The semiconductor device and the method of inspecting a semiconductor device according to the present invention enables a single electrode pad to be used in an optimal state in two or more means having differing purposes. Therefore, for example, effects in that with the single electrode pad, the bonding strength of the bonding wire may be enhanced and electrical characteristics may be measured by passing a large current.

As described above, the semiconductor device and the method of inspecting a semiconductor device are useful for semiconductor devices in which large current flows and are particularly suitable for semiconductor devices that use SiC as a semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an element structure, comprising:
   a semiconductor chip having a front surface and a back surface opposite to the front surface;
   a predetermined element structure provided at a front surface side of the semiconductor chip;
   a first electrode provided on the front surface of the semiconductor chip, and being electrically connected to the element structure;
   a protective film having an opening, and being provided on the first electrode so that a portion of the first electrode is exposed from the protective film;
   an electrode pattern provided on the first electrode, the electrode pattern together with a part of the first electrode forming an electrode pad; and
   a second electrode provided on the back surface of the semiconductor chip, wherein
   the electrode pad includes at least first and second portions having mutually differing layer structures disposed on the front surface of the semiconductor chip and being electrically connected to each other, the first and second portions being exposed from the protective film by the opening.

2. The semiconductor device according to claim 1, wherein the first portion has the first electrode and a hard metal film made of a material having a hardness greater than a hardness of a material of the first electrode.

3. The semiconductor device according to claim 2, wherein the hard metal film is in contact with the first electrode and extends along a direction parallel to the front surface of the semiconductor chip.

4. The semiconductor device according to claim 2, wherein
   the first electrode is a metal film containing aluminum, and
   the hard metal film is a metal film containing one metal among a metal group of gold, silver, copper, nickel, cobalt, tungsten, molybdenum, titanium, and platinum; or a metal alloy film or a stacked metal film, containing at least one metal in the metal group.

5. The semiconductor device according to claim 4, wherein the first electrode is an elementary aluminum film, or an aluminum alloy film containing silicon or copper.

6. The semiconductor device according to claim 2, wherein the hard metal film is provided on a surface of the first portion.

7. The semiconductor device according to claim 2, wherein the hard metal film extends within the first portion.

8. The semiconductor device according to claim 2, wherein the hard metal film is provided between the first portion and the semiconductor chip.

9. The semiconductor device according to claim 2, wherein the hard metal film is disposed symmetrically with respect to a center of the semiconductor chip as a reference, along at least one direction parallel to the front surface of the semiconductor chip.

10. The semiconductor device according to claim 2, wherein the first portion is a pad portion that is connectable to a metal contact for passing a predetermined current in the semiconductor chip when electrical characteristics of the element structure are inspected.

11. The semiconductor device according to claim 2, wherein of the electrode pad disposed within the opening, the second portion excluding the first portion has only the first electrode.

12. The semiconductor device according to claim 11, wherein the second portion is a pad portion where a wire containing aluminum or copper is to be bonded.

13. The semiconductor device according to claim 12, wherein the wire is a plurality of fine metal wires or a ribbon-shaped conductor.

14. The semiconductor device according to claim 1, wherein the protective film is a polyimide film, a silicon nitride film, or a silicon oxide film.

15. The semiconductor device according to claim 1, wherein the semiconductor chip contains silicon carbide.

16. A method of inspecting the semiconductor device according to claim 1, the method comprising:
    contacting and electrically connecting a metal contact with the first portion of the electrode pad and passing current through the semiconductor chip via the metal contact, thereby to inspect electrical characteristics of the predetermined element structure as an inspection process.

17. The method according to claim 16, wherein in the inspection process, a current of at least 300 A/cm$^2$ is passed through the semiconductor chip.

18. The method according to claim 16, wherein
    the element structure is an insulated gate structure formed by a three-layer structure including a metal, an oxide film, and a semiconductor of an insulated-gate bipolar transistor, the insulated-gate bipolar transistor including a collector region and a drift region that form a parasitic diode, and
    in the inspection process, the current flows in a forward direction through a pn junction between the collector region and the drift region of the parasitic diode.

19. The method according to claim 16, wherein the inspection process is performed plural times.

20. The method according to claim 16, wherein the semiconductor chip contains silicon carbide.

* * * * *